(12) United States Patent
Hatwar et al.

(10) Patent No.: US 6,565,996 B2
(45) Date of Patent: May 20, 2003

(54) ORGANIC LIGHT-EMITTING DEVICE HAVING A COLOR-NEUTRAL DOPANT IN A HOLE-TRANSPORT LAYER AND/OR IN AN ELECTRON-TRANSPORT LAYER

(75) Inventors: Tukaram K. Hatwar, Penfield, NY (US); Ralph H. Young, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 54 days.

(21) Appl. No.: 09/875,646

(22) Filed: Jun. 6, 2001

(65) Prior Publication Data

US 2003/0049489 A1 Mar. 13, 2003

(51) Int. Cl.[7] .............................................. H05B 33/14
(52) U.S. Cl. ...................... 428/690; 428/917; 313/502; 313/504; 313/506; 257/101
(58) Field of Search ................. 428/690, 917; 313/504, 502, 506; 257/101

(56) References Cited

U.S. PATENT DOCUMENTS

| 4,539,507 A | | 9/1985 | VanSlyke et al. | |
| 4,720,432 A | * | 1/1988 | Van Slyke et al. | .......... 428/457 |
| 4,769,292 A | | 9/1988 | Tang et al. | |
| 4,885,211 A | | 12/1989 | Tang et al. | |
| 5,593,788 A | | 1/1997 | Shi et al. | |
| 5,645,948 A | | 7/1997 | Shi et al. | |
| 5,776,622 A | | 7/1998 | Hung et al. | |
| 5,853,905 A | | 12/1998 | So et al. | |
| 5,989,737 A | | 11/1999 | Xie et al. | |
| 6,020,078 A | | 2/2000 | Chen et al. | |
| 6,127,004 A | | 10/2000 | Hatwar et al. | |
| 6,208,075 B1 | | 3/2001 | Hung et al. | |
| 6,387,546 B1 | * | 5/2002 | Hamada et al. | ............. 428/690 |
| 6,392,250 B1 | * | 5/2002 | Aziz et al. | ..................... 257/40 |
| 6,395,409 B2 | * | 5/2002 | Ueda et al. | ................. 428/690 |
| 2002/0028346 A1 | * | 3/2002 | Shi et al. | .................... 428/690 |
| 2002/0127427 A1 | * | 9/2002 | Young et al. | ................ 428/690 |

OTHER PUBLICATIONS

"Improving the Efficiency and Stability of Organic Light Emitting Devices by Using Mixed Emitting Layers", by Zoran Popovic et al., SPIE vol. 3476, San Diego, California, Jul. 1998, pp. 68–73.
"Transparent Organic Light Emitting Devices" by G. Gu et al., Appl. Phys. Letter 68 (19), May 6, 1996, pp. 2606–2608.
"Interface Engineering in Preparation of Organic Sufrace–Emitting Diodes" by L. S. Hung et al., Applied Physics Letters, vol. 74, No. 21, May 24, 1999, pp. 3209–3211.

* cited by examiner

Primary Examiner—Cynthia H. Kelly
Assistant Examiner—Dawn Garrett
(74) Attorney, Agent, or Firm—Raymond L. Owens

(57) ABSTRACT

Disclosed are organic electroluminescent devices comprising a substrate, an anode and a cathode disposed over the substrate, an emission layer (EML) disposed between the anode and the cathode, a hole-transport layer (HTL) disposed between the anode and the emission layer, and an electron-transport layer (ETL) disposed between the cathode and the emission layer. A sublayer of the HTL, the ETL, or both the HTL and the ETL comprises a derivative of anthracene as a color-neutral dopant, the sublayer being adjacent to the EML. A color-neutral dopant is a dopant whose presence does not alter the electroluminescent color of the device.

31 Claims, 6 Drawing Sheets

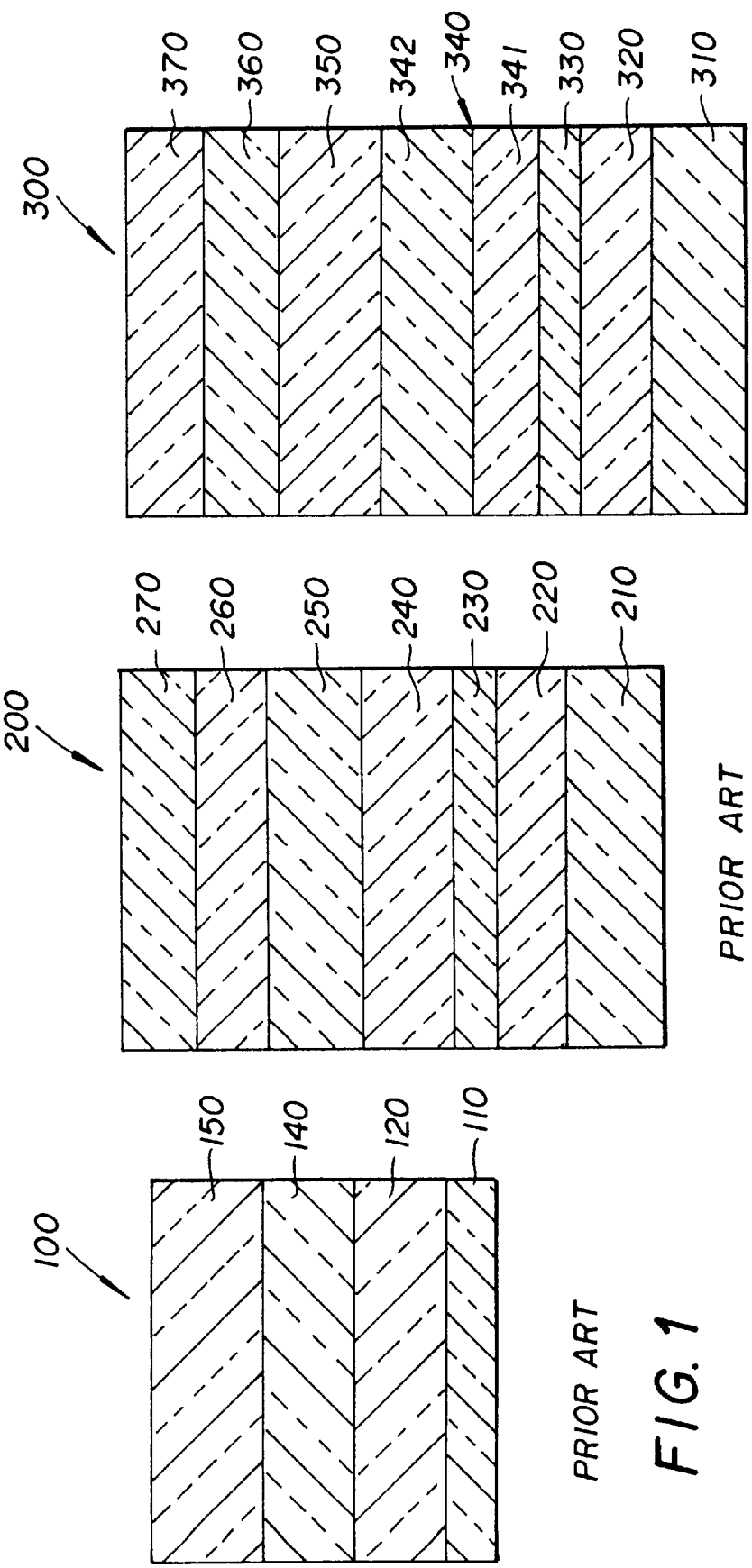

ORGANIC LIGHT-EMITTING DEVICE HAVING A COLOR-NEUTRAL DOPANT IN A HOLE-TRANSPORT LAYER AND/OR IN AN ELECTRON-TRANSPORT LAYER

FIELD OF THE INVENTION

The present invention relates to organic electroluminescent devices and more particularly to doping a hole-transport layer and/or an electron-transport layer with suitable color-neutral dopants to improve the operational lifetime of these devices without affecting the electroluminescent color.

BACKGROUND OF THE INVENTION

A common form of organic electroluminescent device (OLED) includes a substrate and, disposed thereupon, a multilayer structure comprising an anode, an optional hole-injection layer, a hole-transport layer, a luminescent layer, an optional electron-transport layer, and a cathode, each layer of the multilayer structure comprising one or more organic or organometallic compounds. Electroluminescent (EL) devices are attractive because of their low driving voltage, high luminance, wide viewing angle, and capability for full-color flat-panel emissive displays. Tang et al. described this OLED structure in their U.S. Pat. Nos. 4,769,292 and 4,885,211. With the prospect of using OLED in display screens for laptop computers, digital personal organizers, cellular telephones etc., it is highly desirable to improve the operational lifetime of these devices.

The following patents and publications disclose the preparation of OLED with improved operational lifetime. Modifications of the multilayer structure, stabilized cathode materials, and confinement of various carriers and their recombination within the emission zone have achieved significant improvement in the operational lifetime of these devices. So et al., in U.S. Pat. No. 5,853,905, discussed an EL device consisting of a single organic emission layer containing a mixture of electron-transport and hole-transport materials, sandwiched between anode and cathode. However, this device has low efficiency. Popovic et al, in SPIE Conference Proceedings, Vol. 3476, pp. 68–72, 1998, described an EL device with improved efficiency and operational lifetime prepared by mixing an emitting electron-transport material and a hole-transport material in a light-emitting layer. Xie et al., in U.S. Pat. No. 5,989,737, disclosed an OLED in which the hole-transport layer comprises a tertiary aromatic amine doped with a polycyclic aromatic hydrocarbon such as rubrene. This approach has the problem that some dopants, such as rubrene, alter the electroluminescent color of the device.

SUMMARY OF THE INVENTION

It is therefore an object of the present invention to provide an OLED with improved operational lifetime. This object is achieved by providing an organic light-emitting device, comprising:

a) a substrate;
b) an anode and a cathode positioned relative to the substrate;
c) an emission layer disposed between the anode and the cathode;
d) a hole-transport layer disposed between the anode and the emission layer; and
e) an electron-transport layer disposed between the cathode and the emission layer,
f) the hole-transport layer comprising at least two sublayers, the sublayer closest to the emission layer containing a color-neutral dopant, and at least one sublayer not containing the color-neutral dopant; and
g) the color-neutral dopant comprising an anthracene derivative.

This object is also achieved by providing an organic light-emitting device comprising:

a) a substrate;
b) an anode and a cathode positioned relative to the substrate;
c) an emission layer disposed between the anode and the cathode;
d) a hole-transport layer disposed between the anode and the emission layer; and
e) an electron-transport layer disposed between the cathode and the emission layer,
f) the electron-transport layer comprising one or more sublayers, at least one sublayer containing a color-neutral dopant; and
g) the color-neutral dopant comprising an anthracene derivative.

This object is also achieved by providing an organic light-emitting device comprising a) a substrate;
b) an anode and a cathode positioned relative to the substrate;
c) an emission layer disposed between the anode and the cathode;
d) a hole-transport layer disposed between the anode and the emission layer; and
e) an electron-transport layer disposed between the cathode and the emission layer,
f) the electron-transport layer comprising one or more sublayers, at least one sublayer containing a color-neutral dopant,
g) the hole-transport layer comprising one or more sublayers, the sublayer closest to the emission layer containing a color-neutral dopant; and
h) the color-neutral dopants comprising anthracene derivatives.

A color-neutral dopant is a dopant that does not substantially affect the electroluminescent color of the device relative to that of an otherwise identical device from which the dopant is omitted.

ADVANTAGES

The use of a color-neutral dopant permits the electroluminescent color of the present OLEDs to be tuned solely by adjusting the composition of the emission layer. It has been found that certain anthracene derivatives can be used as color-neutral dopants in the hole-transport and/or electron-transport layer of an OLED and that the resulting device has a greater operational lifetime than an otherwise identical device that does not contain the color-neutral dopant.

Other features and advantages of the present invention include the following:

OLEDs with various electroluminescent colors, such as red, green, blue, or white, can be constructed by inclusion of suitable dopants in the emission layer. Thereby, it is possible to construct OLEDs with simultaneously optimized lifetime and chromaticity.

OLEDs of this invention have high luminance efficiency.

OLEDs of this invention can be used with a low-voltage drive source.

The present invention can include the color-neutral dopants in both the hole-transport layer and the electron-transport layer to provide an OLED with greater operational lifetime than would an OLED including the color-neutral dopants into either the hole-transport layer or the electron-transport layer alone.

The devices made in accordance with the present invention have long operational lifetimes and excellent luminance properties.

BRIEF DESCRIPTION OF THE DRAWINGS

FIG. 1 depicts an OLED of the prior art;

FIG. 2 depicts another OLED of the prior art;

FIG. 3 depicts an OLED according to the present invention;

Figure 5:
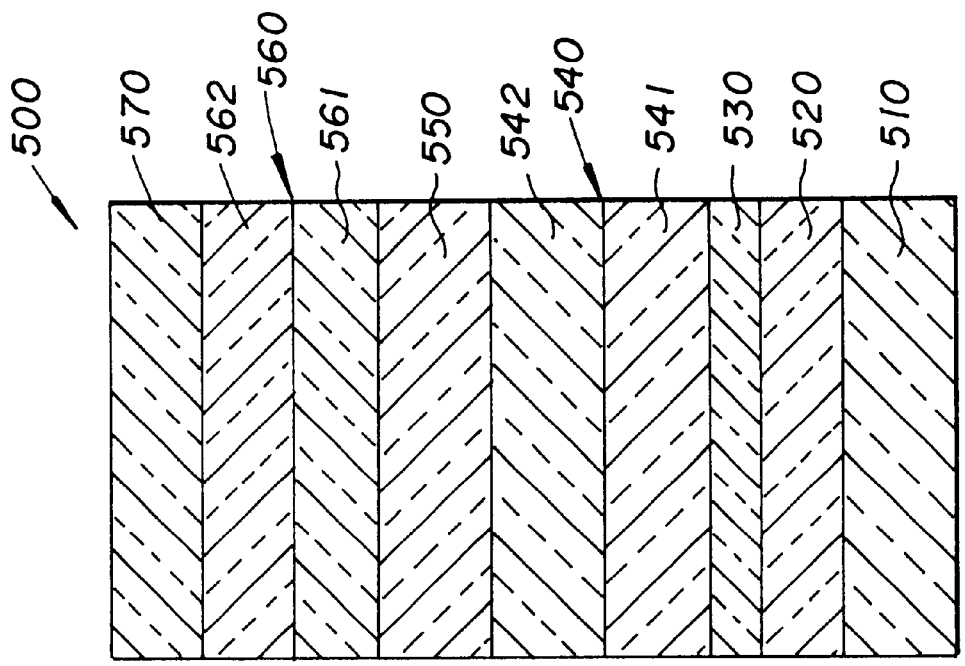
FIG. 5 depicts yet another OLED according to the present invention.

The drawings in FIGS. 1–5 are necessarily of a schematic nature, since the individual layers are too thin and thickness differences of the various elements too great to permit depiction to scale or to permit convenient proportionate scaling.

DETAILED DESCRIPTION OF THE INVENTION

The emission layer (EML) of an OLED comprises an organic or organometallic material that produces light, known as electroluminescence, as a result of electron-hole recombination in the layer. Hereinafter, the term organic will be taken to include both purely organic and organometallic materials. In the simplest construction of the prior art, shown in FIG. 1, an emission layer 140 is sandwiched between an anode 120 and a cathode 150. The emission layer can be a single pure material with a high luminescent efficiency. A well-known material for this purpose is tris(8-quinolinolato-N1,O8)aluminum (Alq), which produces excellent green electroluminescence. The emission layer can also contain lesser amounts of other materials, conventionally called dopants, whose function is to alter the EL efficiency or the color of the emitted light. A substrate 110 provides mechanical support for the OLED and for electrical leads connecting the OLED to a source of electrical current. Layers 110 through 150 together comprise the OLED 100. The cathode, or both the anode and the substrate, are transparent to the electroluminescent light, allowing that light to be viewed. The term transparent refers to the ability to transmit no less than 80 percent of the electroluminescent light in a variant of this structure, the cathode, rather than the anode, rests upon the substrate. In that variant, either the anode, or both the cathode and the support, are transparent to the electroluminescent light. When the cathode and anode are connected to a source of electrical current (not shown), holes are injected from the anode and electrons are injected from the cathode, and they recombine in the emission layer to produce electroluminescent light.

In a more elaborate structure of the prior art, shown in FIG. 2, an emission layer 250 is situated between a hole-transport layer 240 and an electron-transport layer 260. Each of these layers is composed predominantly of organic materials. The two transport layers deliver holes from an anode 220 and electrons from a cathode 270, respectively, to the emission layer. An optional hole-injection layer 230 facilitates the injection of holes from the anode to the hole-transport layer. The emission layer functions as the primary site for electron-hole recombination and emission of the resulting electroluminescent light. In this respect, the functions of the individual organic layers are distinct and can therefore be optimized independently. Thus, the emission layer can be optimized for a desirable EL color and a high luminance efficiency. The emission layer can also contain lesser amounts dopants whose function is to alter the EL efficiency or the color of the emitted light. Likewise, the hole- and electron-transport layers can be optimized for their charge-transport properties. A substrate 210 provides mechanical support for the OLED and for electrical leads connecting the OLED to a source of electrical current. Layers 210 through 270 together comprise the OLED 200. Either the cathode, or both the anode and the substrate, are transparent to the electroluminescent light. In a variant of this structure, the cathode, rather than the anode, rests upon the substrate. In that variant, either the anode, or both the cathode and the support, are transparent to the electroluminescent light. In another variant of this structure, the emission layer and the electron-transport layer can be combined to form a single layer that performs the functions of both. In yet another variant of this structure, an additional hole-injection layer can be inserted between the anode and the hole-transport layer. A function of this additional layer is to facilitate the injection of holes into the hole-transport layer. Similarly, it is possible for the hole-transport layer to comprise at least two sublayers of different compositions, chosen to optimize separately the charge-injecting interface at the anode and the current-carrying properties of the remainder of the hole-transport layer.

When an electrical potential difference (not shown) is applied between the anode 220 and the cathode 270, the cathode injects electrons into the electron-transport layer 260, and they migrate across that layer to the emission layer 250. At the same time, holes are injected from the anode 220 into the hole-transport layer 240, and they migrate across that layer to the emission layer. The holes and electrons recombine in the emission layer 250, frequently near the junction between the hole-transport layer and the emission layer. Part of the energy released by the recombination process is emitted as electroluminescence, which escapes through the transparent anode or cathode and/or the substrate.

FIG. 3 depicts an OLED of the present invention. This OLED 300 is similar to the OLED of the prior art 200 shown in FIG. 2, except that the hole-transport layer 340 consists of two sublayers, 341 and 342, and the sublayer 342 adjacent to the emission layer 350 is doped with a color-neutral dopant of the present invention. Additional components include the substrate 310, anode 320, optional hole-injection layer 330, electron-transport layer (ETL) 360, and cathode 370. Further subdivision of the layers or sublayers into sublayers with varying composition is within the scope of this invention, provided that the emission layer is adjacent to a sublayer of the hole-transport layer containing the color-neutral dopant of this invention. It is also possible for the cathode, rather than the anode, to reside on the substrate. The electrical functions and optical requirements are the same as for the OLED of the prior art shown in FIG. 2.

Figure 4:
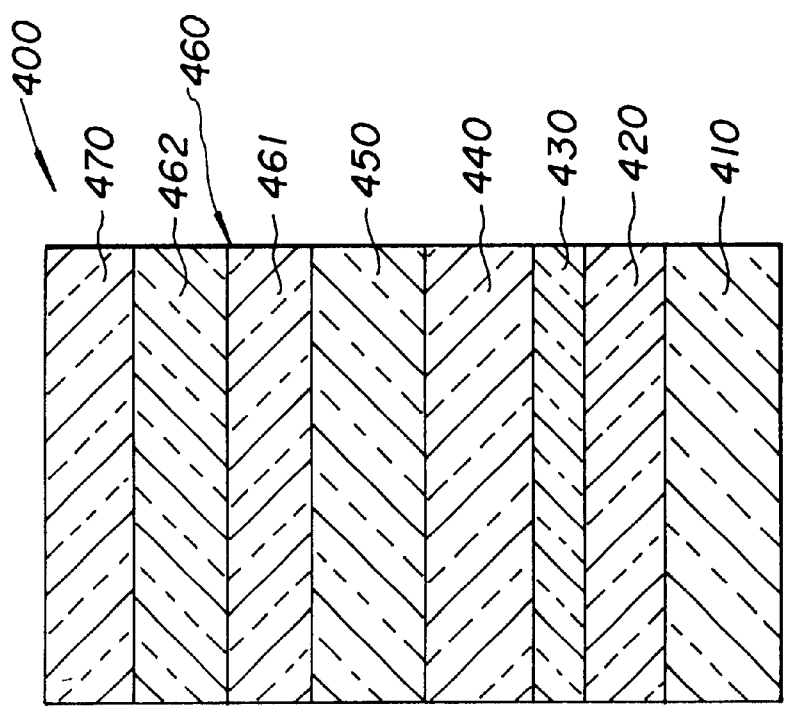
FIG. 4 depicts another OLED according to the present invention.

FIG. 4 depicts another OLED of the present invention. This OLED 400 is similar to the OLED of the prior art 200 except that the electron-transport layer 460 consists of two sublayers, 461 and 462, and the sublayer 461 adjacent to the emission layer 450 is doped with a color-neutral dopant of the present invention. Additional components include the substrate 410, anode 420, optional hole-injection layer 430, hole-transport layer 440, and cathode 470. Sublayer 462 of the electron-transport layer is optional. That is, the entire electron-transport layer 460 can contain the color-neutral dopant of this invention. Further subdivision of the layers or sublayers is within the scope of this invention. It is also possible for the cathode, rather than the anode, to reside on the substrate. The electrical functions and optical requirements are the same as for the OLED of the prior art shown in FIG. 2.

FIG. 5 depicts yet another OLED of the present invention. This OLED 500 is similar to OLED 200 of the prior art but includes the inventive features of both OLEDs 300 and 400. The hole-transport layer 540 consists of two sublayers, 541 and 542, and the sublayer 542 adjacent to the emission layer 550 is doped with a color-neutral dopant of the present invention. The electron-transport layer 560 consists of two sublayers, 561 and 562, and the sublayer 561 adjacent to the emission layer 550 is doped with a color-neutral dopant of the present invention. The same or different color-neutral dopants can be used in sublayers 542 and 561. Sublayers 541 and 562 are optional. That is, the entire hole-transport layer 540 and/or the entire electron-transport layer 560 can contain the color-neutral dopant of this invention. Additional components include the substrate 510, anode 520, optional hole-injection layer 530, and cathode 570. Further subdivision of the layers or sublayers is within the scope of this invention. It is also possible for the cathode, rather than the anode, to reside on the substrate. The electrical functions and optical requirements are the same as for the OLED of the prior art shown in FIG. 2.

The substrate of an OLED can be constructed of glass, quartz, or a plastic material and can, optionally, incorporate additional layers serving additional functions such as color-filter layers to remove unwanted spectral components from the electroluminescent light.

An OLED can be viewed as a diode, which is forward biased when the anode is at a higher electrical potential than the cathode. The anode and cathode of the OLED can each take any convenient conventional form, such as any of the various forms disclosed by Tang et al. U.S. Pat. No. 4,885,211. The operating voltage can be substantially reduced by use of a low-work-function cathode and a high-work-function anode.

For most purposes, the preferred cathodes are those constructed of a combination of a metal having a work function less than 4.0 eV and one at least one other metal. The Mg:Ag alloy of Tang et al., U.S. Pat. No. 4,885,211, constitutes one preferred cathode material. Hung et al., in U.S. Pat. No. 5,776,622, have disclosed the use of a LiF|Al bilayer to enhance electron injection in OLEDs. This and similar bilayers can be used as cathodes in the present invention. In some cases, it is desirable to fabricate an OLED using an opaque support such as a silicon substrate. In such cases, it is preferred to use a cathode material that is transparent in the range of wavelengths emitted by the OLED, as described in publications by Gu et al., Applied Physics Letters, vol. 68, 2606 (1996) and Hung et al., Applied Physics Letters, vol. 74, 3209 (1999).

Conventional anodes are formed of a conductive and transparent metal oxide. Indium tin oxide (ITO) has been widely used as the anode material because of its transparency, good conductivity, and high work function. It is the preferred anode material in the present invention.

In a preferred embodiment, a hole-injection layer is disposed between the anode and the hole-transport layer. A preferred material in such a hole injection layer is a fluorocarbon ($CF_x$) such as those disclosed in commonly assigned U.S. Pat. No. 6,208,075 by Hung et al. and U.S. Pat. No. 6,127,004 by Hatwar et al.

A preferred embodiment of the emission layer comprises a host material capable of transporting both electrons and holes and doped with a relatively small amount of one or more fluorescent molecules known as dopants, as described by Tang et al. in U.S. Pat. No. 4,769,292. Conventional host materials for the emission layer include metal complexes with the 8-hydroxyquinolate anion, also known as metal-chelated oxinoid compounds, and metal complexes with derivatives of 8-hydroxyquinolate. Examples include tris(8-quinolinolato-N1,O8)aluminum (Alq), tris(8-quinolinolato-N1,O8)gallium (Gaq), bis(8-quinolinolato-N1,O8) magnesium (Mgq), bis(8-quinolinolato-N1,O8)zinc (Znq), and the like. Most preferred among these complexes is Alq.

Another class of conventional host materials for the emission layer includes 9,10-diaryl-substituted anthracenes such as 9,10-bis(4-(2,2-diphenylethenyl)phenyl)anthracene, and ADN and TBADN, whose structures are shown below.

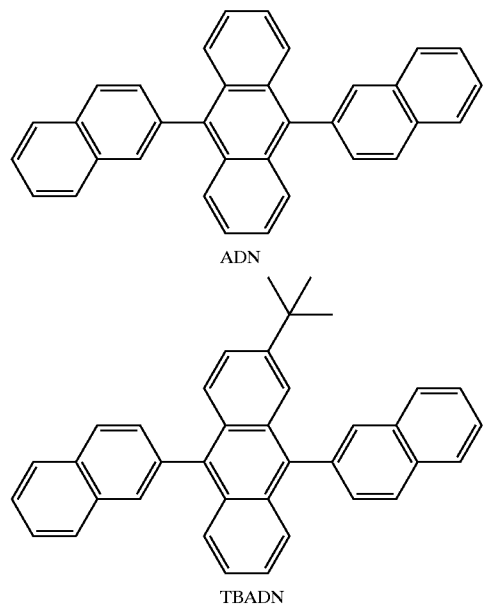

ADN

TBADN

Preferred among these anthracene derivatives are ADN and TBADN.

The choice of host material for the emission layer depends, in part, on the desired emission color and/or the dopant, if any, to be used in that layer. Host materials comprising metal complexes with derivatives of 8-hydroxyquinolate, such as Alq, are useful with dopants of the coumarin or quinacridone class for green emission and derivatives DCM for red emission. A preferred green-emitting coumarin is C545T as described by Chen et al. in U.S. Pat. No. 6,020,078. A preferred green-emitting quinacridone is CFDMQA as described by Shi et al. in U.S. Pat. No. 5,593,788.

A preferred red-emitting dye, which is a derivative of DCM, is DCJTB. The structures of DCM and DCJTB are shown below

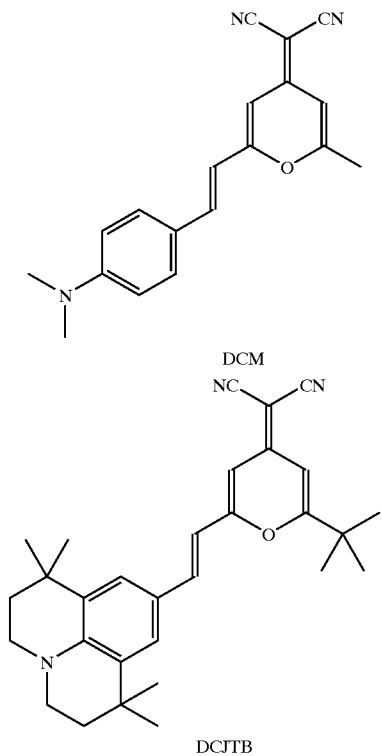

Host materials comprising 9,10-diaryl-substituted anthracenes are particularly useful with blue-emitting dopants such as derivatives of perylene. A preferred perylene derivative is TBP, namely, 2,5,8,11-tetra-tert-butylperylene.

The quantity of a dopant in an emission layer, relative to the host material, is usually between 0.01 and 10% and preferably between 0.5 and 2%. Other host materials and other dopants can be used in the present invention.

Materials useful in the electron-transport layer of this invention include metal complexes with the 8-hydroxyquinolate anion, such as those described above, as disclosed in U.S. Pat. No. 4,885,211. Such materials both exhibit high levels of performance and are readily fabricated in thin layers. They can be used as the sole material of an undoped electron-transport layer or an undoped sublayer of an electron-transport layer. They can also be used as the host material in a doped sublayer of an electron-transport layer. Materials of this class are currently preferred. Most preferred is Alq. Other materials known in the art can be used in the electron-transport layer of this invention. An example is TPBI, described in U.S. Pat. No. 5,645,948 by Shi et al. If a transparent cathode is used, it is preferred to use materials in the electron-transport layer that are also transparent.

Materials useful in the hole-transport layer of this invention include tertiary amines as taught in VanSlyke in U.S. Pat. No. 4,539,507. They can be used as the sole material of an undoped hole-transport layer or an undoped sublayer of a hole-transport layer. They can also be used as the host material in a doped sublayer of a hole-transport layer. Materials of this class are currently preferred. Most preferred is NPB, namely 4,4'-Bis[N-(1-napthyl)-N-phenylamino]biphenyl as described by VanSlyke et al. in US Pat. No. 4,539,507.

A color-neutral dopant is a dopant that does not substantially affect the electroluminescent color of the device relative to that of an otherwise identical device from which the dopant is omitted. A dopant can be color-neutral if, when used in an OLED, it does not luminesce. It can fail to luminesce because the lifetimes of its excited states are too short for radiation to occur with any substantial probability, either because of the intrinsic nature of the dopant or as a consequence of its environment inside the OLED. It can fail to luminesce if, when raised to an excited energy level, it transfers its energy to another component of the OLED. In this case, for the dopant to be color-neutral, any transfer of energy to a component of the OLED that is luminescent must result in luminescence of the same color as that of the OLED without the color-neutral dopant. A color-neutral dopant can fail to luminesce if, in the normal functioning of the OLED, the dopant is rarely raised to an excited state. A dopant can be color-neutral if, when used in an OLED, the color of any luminescence from the dopant has the same color as that of an otherwise similar OLED from which the dopant is omitted.

The color-neutral dopants useful in the present invention are substituted anthracene compounds. The substituents can be alkyl, substituted alkyl, aryl, substituted aryl, halo, cyano, alkoxy, or the like. Preferred among these are compounds whose intrinsic luminescence is in the blue region of the spectrum. Preferred color-neutral dopants are anthracene derivatives substituted with aryl or substituted aryl groups at the 9 and 10 positions as conventionally designated. Examples are 9,10-diphenylanthracene, ADN, TBADN, and 9,10-bis[4-(2,2-diphenylethenyl)phenyl]anthracene. Currently preferred as color-neutral dopants are ADN and TBADN. When used as a color-neutral dopant in a sublayer of a hole-transport layer or electron-transport layer, the anthracene compounds comprise between 0.1 and 25% by volume of the sublayer and preferably between 1 and 15% by volume.

The thickness of the hole-transport layer is between 20 and about 200 nm and preferably between 70 and 150 nm. The thickness of the emission layer is between 20 and about 100 nm and preferably between 20 and 75 nm. The thickness of the electron-transport layer is between 20 and about 100 nm and preferably between 20 and 75 nm. When the hole-transport layer comprises a sublayer containing a color-neutral dopant and disposed adjacent to the emission layer (sublayer 342 in FIG. 3 or sublayer 542 in FIG. 5), the thickness of the sublayer is between 2 and about 200 nm and preferably between 10 and 100 nm. When the hole-transport layer comprises a sublayer lacking a color-neutral dopant and disposed adjacent to the anode (sublayer 341 in FIG. 3 or sublayer 541 in FIG. 5), the thickness of the sublayer is between 2 and about 200 nm and preferably between 10 and 100 nm. Similarly, when the electron-transport layer comprises a sublayer containing a color-neutral dopant and disposed adjacent to the emission layer (sublayer 461 in FIG. 4 or 561 in FIG. 5), the thickness of the sublayer is between 2 and 50 nm and preferably between 10 and 35 nm. When the electron-transport layer comprises a sublayer lacking a color-neutral dopant and disposed adjacent to the cathode (sublayer 462 in FIG. 4 or sublayer 562 in FIG. 5), the thickness of the sublayer is between 2 and 50 nm and preferably between 20 and 40 nm. The thickness of the cathode layer is between 20 and 200 nm and preferably between 50 nm and 200 nm.

Devices of the structure shown in FIG. 5, in which a color-neutral dopant of the present invention is present in both a sublayer of the hole-transport layer and a sublayer of the electron-transport layer, have significantly greater operational lifetimes than devices in which a color-neutral dopant of the present invention is present in a sublayer of only the hole-transport or only the electron-transport layer. In devices of this structure, the sublayer of the hole-transport layer that contains the color-neutral dopant of this invention can extend to the anode, that is, sublayer 541 can be omitted. In devices of the structures shown in FIGS. 4 and 5, sublayers 462 and 562 can also be omitted.

In any of the OLED structures of the present invention, as described above, an additional increase in operational lifetime can be obtained by use of an emission layer comprising a color-neutral dopant in addition to the luminescent dopant, if any, that determines the emission properties of the device. The volume percentage of the color-neutral dopant in the emission layer is between 0.1% and 25% and preferably between 1% and 15%.

A useful method for constructing OLED of the present invention includes vapor deposition in a vacuum chamber. This method permits the organic layers and the metal cathode to be deposited sequentially upon the anode without significant interference or mixing of the layers. The thickness of each individual layer and its composition can be precisely controlled in the deposition process. To produce the desired composition of each layer, the rate of deposition for each component is independently controlled using a deposition rate monitor.

EXAMPLES

The invention and its advantages are further illustrated by the specific examples that follow. In describing the concentration of a dopant, any percentage refers to percentage by volume of the dopant with respect to the total material in the layer.

Comparative Example 1

An OLED of the prior art was constructed in the following manner. Glass substrates coated with an 80 nm layer of ITO for use as an anode were sequentially ultrasonicated in a commercial detergent, rinsed in deionized water, and degreased in toluene vapor. The ITO layer was treated with an oxygen plasma for about one minute and then coated with 1 nm of a fluorocarbon layer by plasma assisted deposition of $CHF_3$ to produce a $CF_x$ hole-injection layer. The resulting coated substrates were transferred to a vacuum chamber. There, the following additional layers were deposited in sequence over the hole-injection layer by vacuum vapor deposition: 150 nm of NPB as the hole-transport layer (HTL), 37.5 nm of undoped Alq as the emission layer (EML), 37.5 nm of undoped Alq as the electron-transport layer (ETL), and 200 nm of a MgAg alloy (in the ratio 90:10%). The above sequence completed the construction of the OLED. The OLED was transferred to a glove box filled with dry nitrogen, where it was enclosed along with a desiccant in a hermetically-sealed package for protection against the ambient environment.

The ITO coating on the glass substrates was patterned so that several OLEDs were produced on one substrate. The EL characteristics of one of these OLEDs were evaluated using a constant-current source and a photometer. The initial luminance efficiency, CIE coordinates, and drive voltage, all at a current density of 20 $mA/cm^2$, are shown in Table I. The operational stability of this OLED was evaluated by operating it at a constant current density of 20 $mA/cm^2$ while monitoring its luminance and drive voltage. The luminance and drive voltage, relative to their initial values, are shown as functions of operating time in FIGS. 6 and 7, respectively. The EL characteristics and operational stability of additional OLEDs described below were evaluated at the same current density and in the same manner as in this Example.

Example 2

Figure 6:
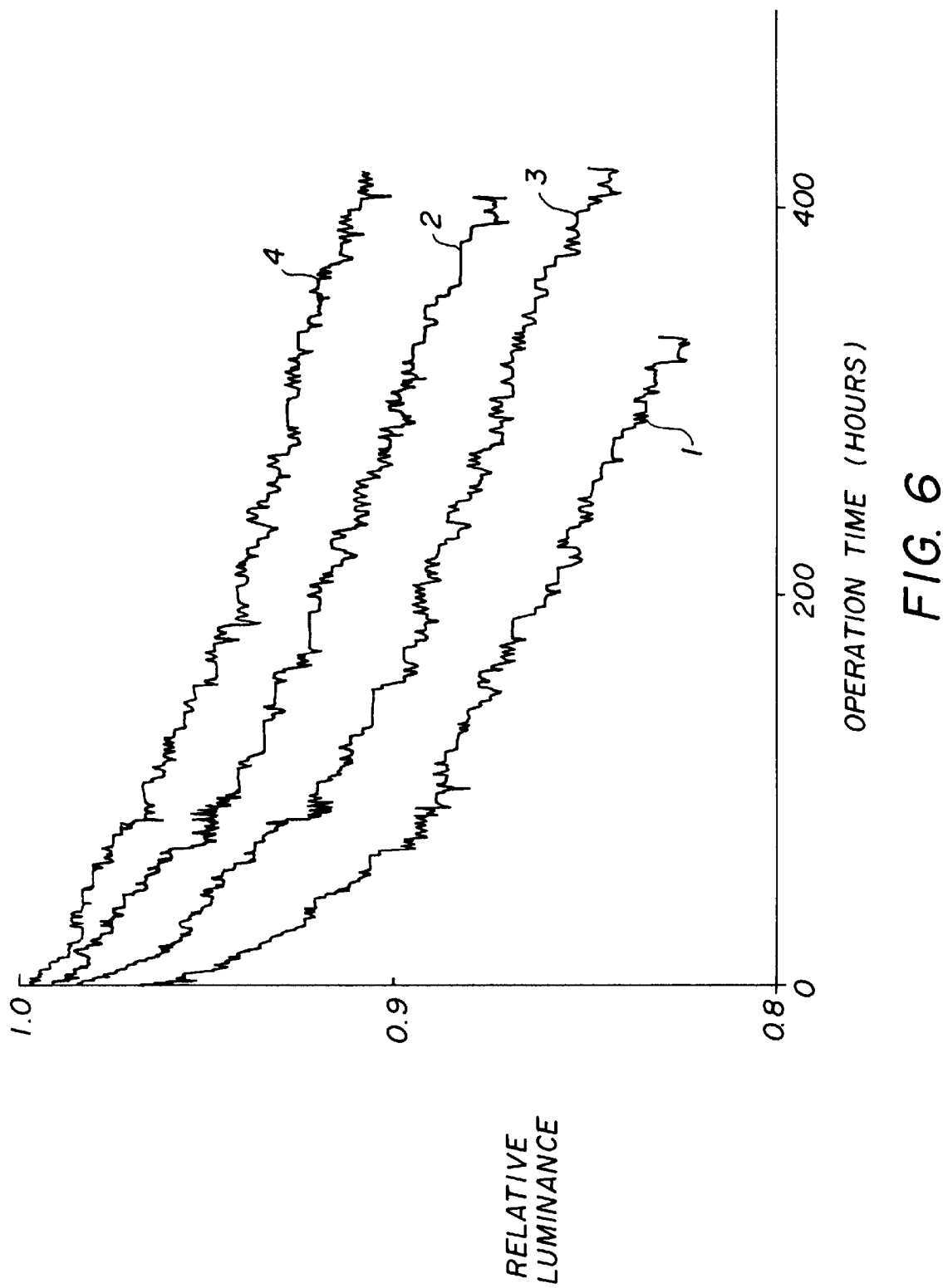
FIG. 6 is a graph showing the luminance as a function of operation time, relative to the initial luminance, for green emitting OLEDs according to the present invention.
Figure 7:
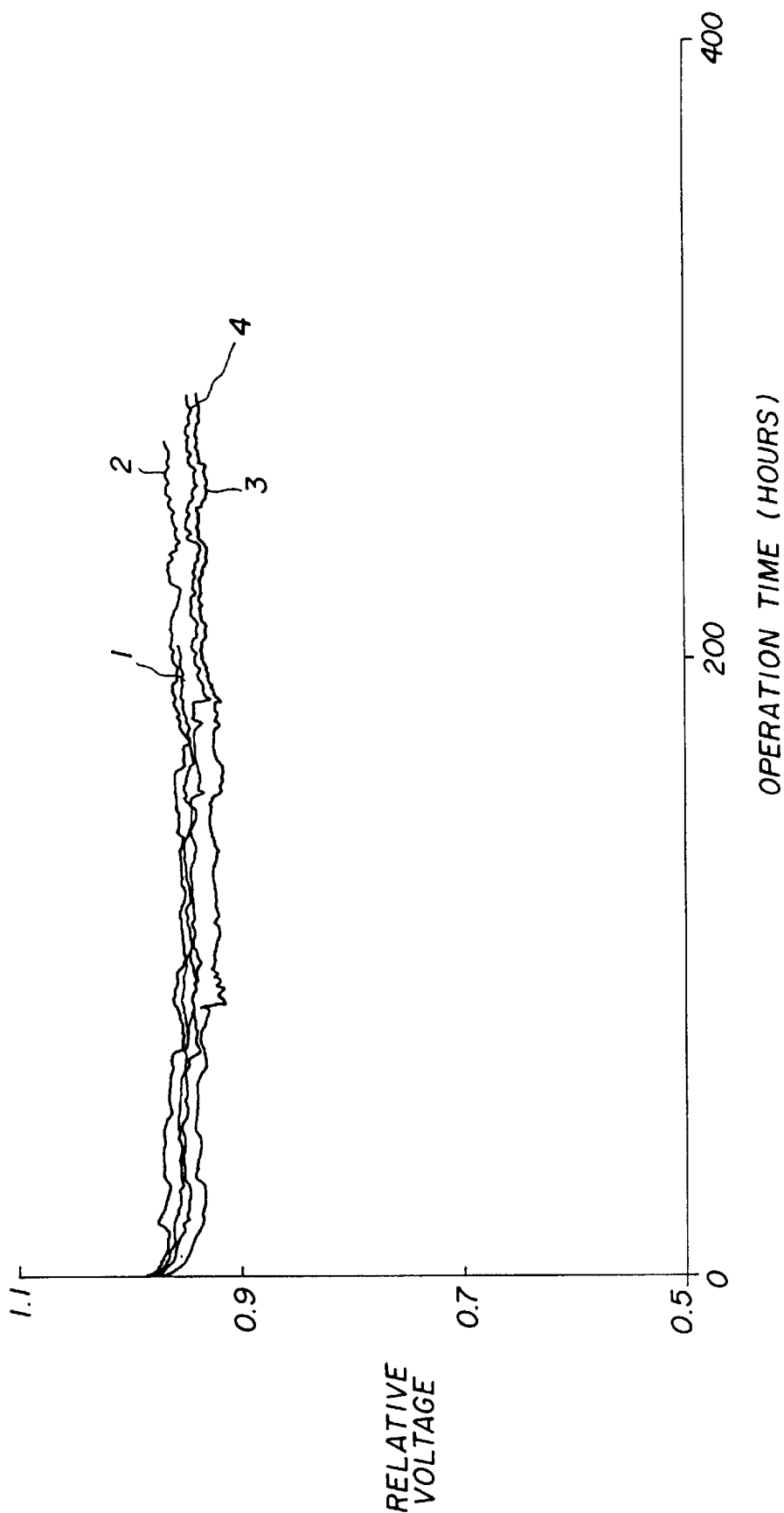
FIG. 7 is a graph showing the driving voltage as a function of operation time, relative to the initial driving voltage, for the OLEDs used to produce the data in FIG. 6.

An OLED of the present invention was constructed with the structure shown in FIG. 3. The hole-transport layer (340) consisted of a 120 nm sublayer (341) of undoped NPB and a 30 nm sublayer (342) of NPB doped with ADN as a color-neutral dopant, the ADN comprising 5% of the sublayer. In all other regards, the structure and construction of this device were the same as for the OLED of Comparative Example 1. The initial luminance efficiency, CIE coordinates, and drive voltage are also shown in Table I. The relative luminance and drive voltage as functions of operating time are also shown in FIGS. 6 and 7, respectively.

Example 3

An OLED of the present invention was constructed with the structure shown in FIG. 4. The electron-transport layer (460) consisted of a 20 nm sublayer (461) of Alq doped with ADN as a color-neutral dopant, the ADN comprising 5% of the layer, and a 15 nm sublayer (462) of undoped Alq. In all other regards, the structure and construction of this device were the same as for the OLED of Comparative Example 1. The initial luminance efficiency, CIE coordinates, and drive voltage are also shown in Table I. The relative luminance and drive voltage as functions of operating time are also shown in FIGS. 6 and 7, respectively.

Example 4

An OLED of the present invention was constructed with the structure shown in FIG. 5. The hole-transport layer (540) consisted of a 120 nm sublayer (541) of undoped NPB and a 30 nm sublayer (542) of NPB doped with ADN as a color-neutral dopant, the ADN comprising 5% of the sublayer. The electron-transport layer (560) consisted of a 20 nm sublayer (561) of Alq doped with ADN as a color-neutral dopant, the ADN comprising 5% of the layer, and a 15 nm sublayer (562) of undoped Alq. In all other regards, the structure and construction of this device were the same as for the OLED of Comparative Example 1. The initial luminance efficiency, CIE coordinates, and drive voltage are also shown in Table I. The relative luminance and drive voltage as functions of operating time are also shown in FIGS. 6 and 7, respectively.

TABLE I

Composition and EL properties of the OLEDs of Examples 1–4. In Columns 2, 3, and 4, a check mark (✓) indicates presence of a color-neutral dopant in the HTL, EML, or ETL, respectively. Columns 5–8 refer to initial performance at a current density of 20 mA/cm².

| Example | Color-neutral dopant in | | | Luminance yield | | | Drive voltage |
| --- | --- | --- | --- | --- | --- | --- | --- |
| | HTL | EML | ETL | (cd/A) | CIEx | CIEy | (V) |
| 1 | | | | 2.4 | 0.34 | 0.54 | 8.1 |
| 2 | ✓ | | | 2.5 | 0.34 | 0.54 | 8.2 |
| 3 | | | ✓ | 2.4 | 0.35 | 0.54 | 8.3 |
| 4 | ✓ | | ✓ | 2.4 | 0.34 | 0.54 | 8.1 |

In FIGS. 6 and 7, the traces are identified with the corresponding Examples by the numerals to the right of the traces. The data in FIG. 6 show that the decrease in luminance during extended operation is much more gradual for the OLEDs of the present invention, Examples 2–4, than for the OLED of the prior art, Comparative Example 1. Moreover, the OLED of Example 4, wherein both the HTL and the ETL comprise sublayers containing the color-neutral dopant, exhibits an even more gradual decrease in luminance than the OLEDs of Examples 2 and 3, wherein only the HTL or only the ETL comprises such a sublayer. Thus, the OLEDs of the present invention have greatly improved operational stability with respect to luminance relative to the prior art. As shown in FIG. 7, the variation in the drive voltage is small for both the OLEDs of the present invention and the OLED of the prior art. Therefore, the improved operational stability with respect to the luminance is achieved without any significant loss of stability with respect to drive voltage. Therefore, OLEDs of the present invention possess far greater operational lifetimes than OLEDs of the prior art. The data in Table I show that the use of a color-neutral dopant according to the present invention does not affect the initial EL performance significantly. Thus, the improvements in operational lifetime are achieved without any significant adverse effect on other parameters of EL performance.

Comparative Example 5

An OLED of the prior art was constructed similarly to that of Comparative Example 1, with the following exceptions. The EML was 20 nm thick and consisted of ADN doped with 2% TBP. The ETL was 35 nm thick and consisted of undoped Alq. The initial luminance efficiency, CIE coordinates, and drive voltage are shown in Table II. The luminance and drive voltage, relative to their initial values, are shown as functions of operating time in FIGS. 8 and 9, respectively.

Example 6

Figure 8:
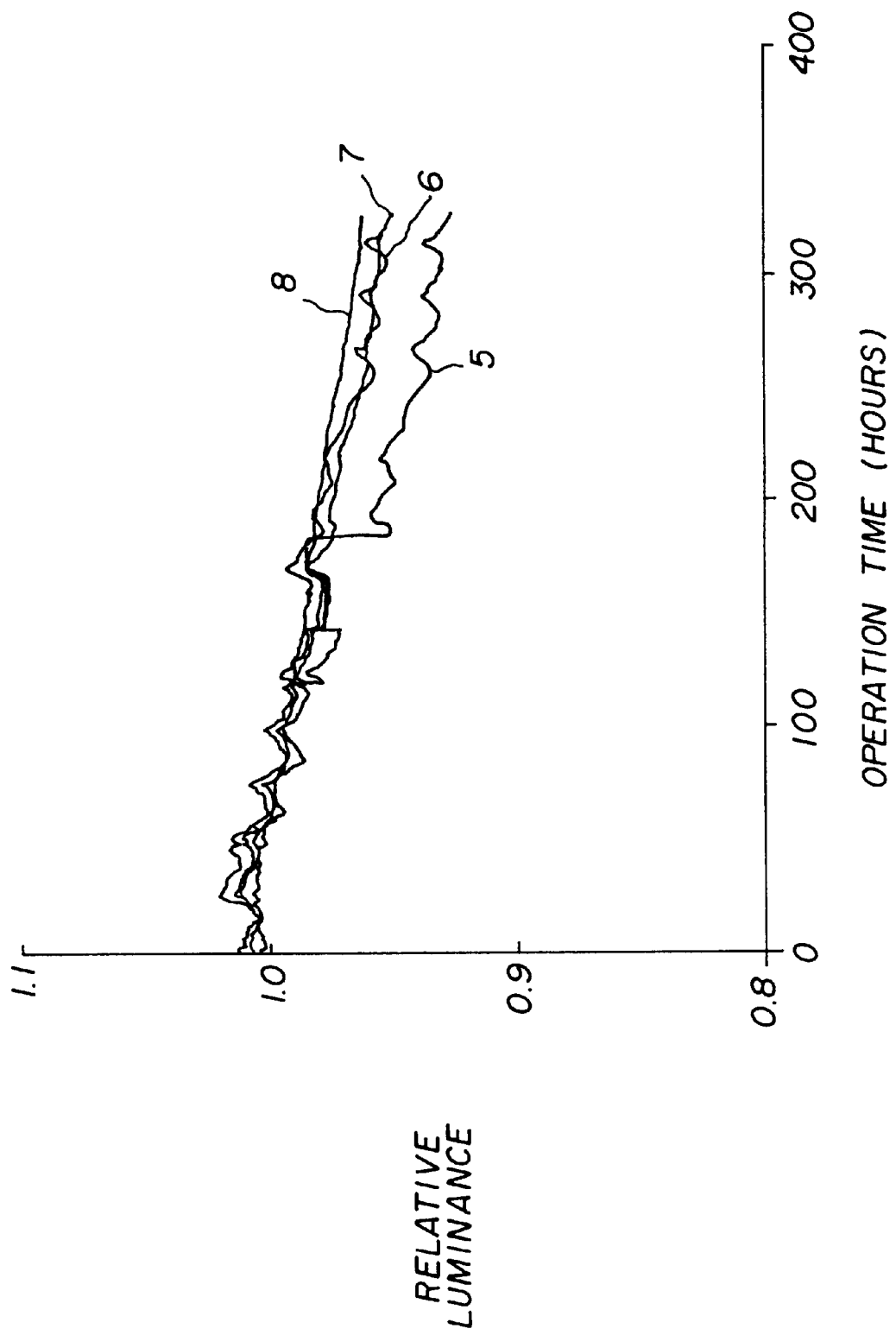
FIG. 8 is a graph showing the relative luminance as a function of operation time for blue-emitting OLEDs according to the present invention.
Figure 9:
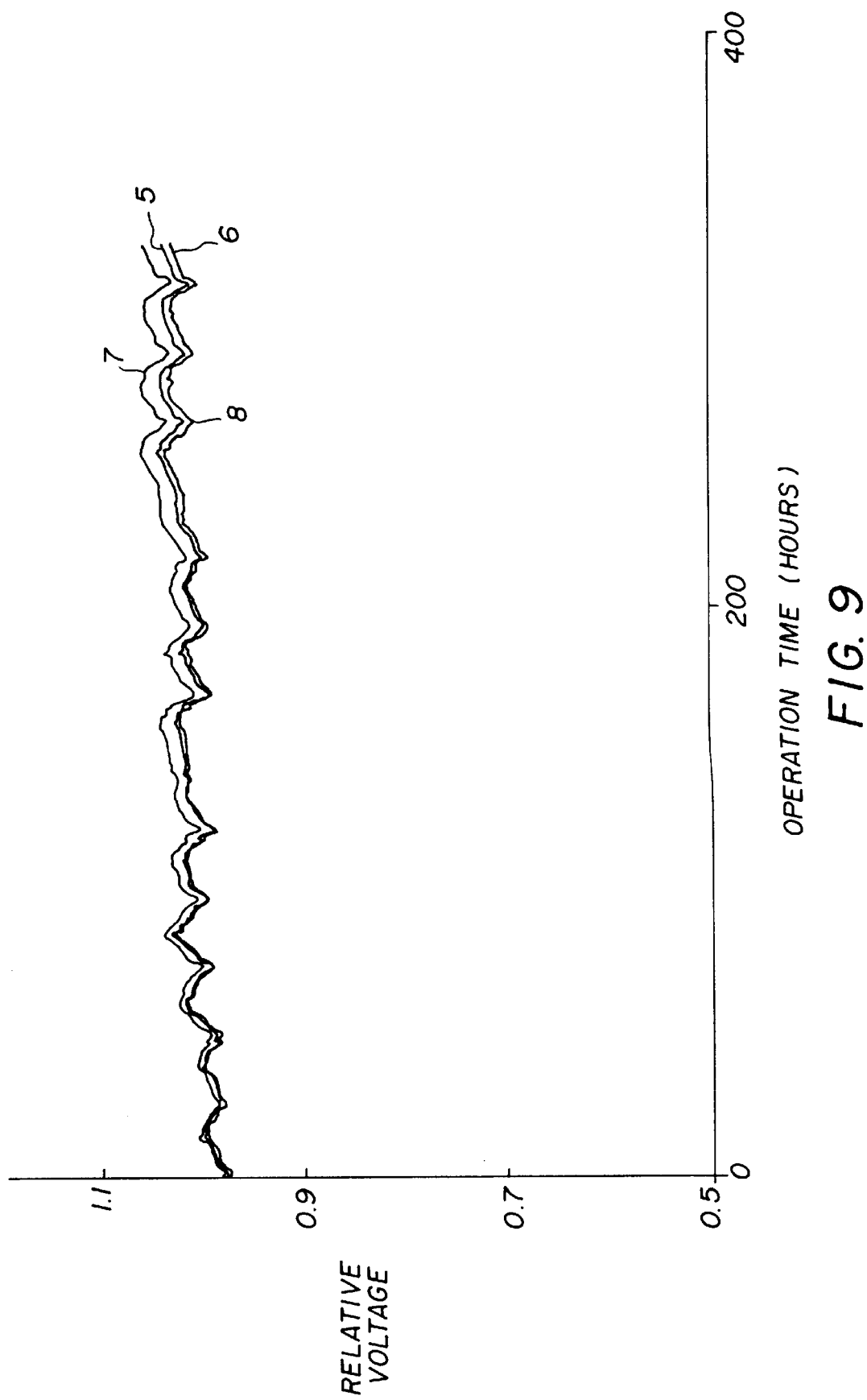
FIG. 9 is a graph showing the relative driving voltage as a function of operation time for the OLEDs used to produce the data in FIG. 8.

An OLED of the present invention was constructed with the structure shown in FIG. 3. The hole-transport layer (340) consisted of a 120 nm sublayer (341) of undoped NPB and a 30 nm sublayer (342) of NPB doped with ADN as a color-neutral dopant, the ADN comprising 10% of the sublayer. In all other regards, the structure and construction of this device were the same as for the OLED of Comparative Example 5. The initial luminance efficiency, CIE coordinates, and drive voltage are also shown in Table II. The relative luminance and drive voltage as functions of operating time are also shown in FIGS. 8 and 9, respectively.

Example 7

An OLED of the present invention was constructed with the structure shown in FIG. 4. The electron-transport layer (460) consisted of a 20 nm sublayer (461) of Alq doped with ADN as a color-neutral dopant, the ADN comprising 10% of the layer, and a 15 nm sublayer (462) of undoped Alq. In all other regards, the structure and construction of this device were the same as for the OLED of Comparative Example 5. The initial luminance efficiency, CIE coordinates, and drive voltage are also shown in Table II. The relative luminance and drive voltage as functions of operating time are also shown in FIGS. 8 and 9, respectively.

Example 8

An OLED of the present invention was constructed with the structure shown in FIG. 5. The hole-transport layer (540) consisted of a 120 nm sublayer (541) of undoped NPB and a 30 nm sublayer (542) of NPB doped with ADN as a color-neutral dopant, the ADN comprising 10% of the sublayer. The electron-transport layer (560) consisted of a 20 nm sublayer (561) of Alq doped with ADN as a color-neutral dopant, the ADN comprising 10% of the layer, and a 15 nm sublayer (562) of undoped Alq. In all other regards, the structure and construction of this device were the same as for the OLED of Example 5. The initial luminance efficiency, CIE coordinates, and drive voltage are also shown in Table II. The relative luminance and drive voltage as functions of operating time are also shown in FIGS. 8 and 9, respectively.

TABLE II

Composition and EL properties of the OLEDs of Examples 5–8. In Columns 2, 3, and 4, a check mark (✓) indicates presence of a color-neutral dopant in the HTL, EML, or ETL, respectively. Columns 5–8 refer to initial performance at a current density of 20 mA/cm².

| Example | Color-neutral dopant in | | | Luminance yield | | | Drive voltage |
| --- | --- | --- | --- | --- | --- | --- | --- |
| | HTL | EML | ETL | (cd/A) | CIEx | CIEy | (V) |
| 5 | | | | 2.7 | 0.15 | 0.22 | 7.9 |
| 6 | ✓ | | | 2.6 | 0.15 | 0.23 | 8.0 |
| 7 | | | ✓ | 2.6 | 0.15 | 0.22 | 7.9 |
| 8 | ✓ | | ✓ | 2.3 | 0.15 | 0.23 | 8.1 |

In FIGS. 8 and 9, the traces are identified with the corresponding Examples by the numerals to the right of the traces. The conclusions to be drawn from these Figures are similar to those drawn from FIGS. 6 and 7 concerning Examples 1–4. The data in FIG. 8 show that the decrease in luminance during extended operation is much more gradual for the OLEDs of the present invention, Examples 6–8, than for the OLED of the prior art, Comparative Example 5. Moreover, the OLED of Example 8, wherein both the HTL and the ETL comprise sublayers containing the color-neutral dopant, exhibits an even more gradual decrease in luminance than the OLEDs of Examples 6 and 7, wherein only the HTL or only the ETL comprises such a sublayer. Thus, the OLEDs of the present invention have greatly improved operational stability with respect to luminance relative to the prior art. As shown in FIG. 9, the drive voltage initially decreases by a small amount, approximately 2%, then rises very gradually. The overall variation in the drive voltage is small for both the OLEDs of the present invention and the OLED of the prior art. Therefore, the improved operational stability in terms of the luminance is achieved without any significant loss of stability with respect to drive voltage. Therefore, OLEDs of the present invention possess far greater operational lifetimes than OLEDs of the prior art. The data in Table II show that the use of a color-neutral dopant according to the present invention does not affect the initial EL performance significantly. Thus, the improvements in operational lifetime are achieved without any significant adverse effect on other parameters of EL performance.

The invention has been described in detail with particular reference to certain preferred embodiments thereof, but it will be understood that variations and modifications can be effected within the spirit and scope of the invention.

PARTS LIST

100 OLED with a simple structure
110 substrate
120 anode
140 emission layer
150 cathode
200 OLED with a multilayer structure
210 substrate
220 anode
230 hole-injection layer (HIL)
240 hole-transport layer (HTL)
250 emission layer (EML)
260 electron-transport layer (ETL)
270 cathode
300 OLED
310 substrate
320 anode
330 HIL
340 HTL
341 hole-transport sublayer 1
342 hole-transport sublayer 2
350 emission layer (EML)
360 ETL
370 cathode
400 OLED
410 substrate
420 anode
430 HIL
440 HTL
450 EML

PARTS LIST (CON'T)

460 ETL
461 electron-transport sublayer 1
462 electron-transport sublayer 2
470 cathode
500 OLED
510 substrate
520 anode
530 HIL
540 HTL
541 hole-transport sublayer 1
542 hole-transport sublayer 2
550 EML
560 ETL
561 electron-transport sublayer 1
562 electron-transport sublayer 2
570 cathode

What is claimed is:

1. An organic light-emitting device comprising:
   a) a substrate;
   b) an anode and a cathode spaced from each other and disposed over the substrate;
   c) an emission layer disposed between the anode and the cathode;
   d) a hole-transport layer disposed between the anode and the emission layer;
   e) an electron-transport layer disposed between the cathode and the emission layer,
   f) the hole-transport layer comprising at least two sublayers, the sublayer closest to the emission layer containing a color-neutral dopant, and at least one sublayer not containing the color-neutral dopant; and
   g) the color-neutral dopant comprising an anthracene derivative.

2. The device of claim 1 further including a hole-injection layer disposed between the anode and the hole-transport layer.

3. The device of claim 1 wherein the sublayer closest to the anode has a thickness in the range of 2 to 200 nm and the sublayer closest to the emission layer has a thickness in a range of 2 to 200 nm.

4. The device of claim 1 wherein each sublayer of the hole-transport layer comprises a tertiary aromatic amine.

5. The device of claim 1 wherein the color-neutral dopant comprises 9,10-di-2-naphthaleneylanthracene or 2-(1,1-dimethylethyl)-9,10-di-2-naphthaleneylanthracene.

6. The device of claim 1 wherein the color-neutral dopant comprises between 0.1 and 25 percent by volume of each sublayer of the hole-transport layer in which it is present.

7. The device of claim 1 wherein the emission layer comprises Alq, Gaq, Inq, or Mgq.

8. The device of claim 1 wherein the emission layer comprises 9,10-di-2-naphthaleneylanthracene or 2-(1,1-dimethylethyl)-9,10-di-2-naphthaleneylanthracene.

9. An organic light-emitting device comprising:
   a) a substrate;
   b) an anode and a cathode spaced from each other and disposed over the substrate;
   c) an emission layer disposed between the anode and the cathode;
   d) a hole-transport layer disposed between the anode and the emission layer;
   e) an electron-transport layer disposed between the cathode and the emission layer;
   f) the electron-transport layer comprising one or more sublayers, at least one sublayer containing a color-neutral dopant; and
   g) the color-neutral dopant comprising an anthracene derivative.

10. The device of claim 9 further including a hole-injection layer disposed between the anode and the hole-transport layer.

11. The device of claim 9 wherein the sublayer of the electron-transport layer that is closest to the cathode does not contain the color-neutral dopant.

12. The device of claim 9 wherein the sublayer of the electron-transport layer closest to the cathode has a thickness in the range of 2 to 50 nm and the sublayer closest to the emission layer has a thickness in a range of 2 to 50 nm.

13. The device of claim 9 wherein the electron-transport layer comprises Alq, Gaq, Inq, or Mgq.

14. The device of claim 9 wherein the color-neutral dopant comprises 9,10-di-2-naphthaleneylanthracene or 2-(1,1-dimethylethyl)-9,10-di-2-naphthaleneylanthracene.

15. The device of claim 9 wherein the color-neutral dopant comprises between 0.1 and 25 percent by volume of the sublayer adjacent to the emission layer in which it is present.

16. The device of claim 9 wherein the emission layer comprises Alq, Gaq, Inq, or Mgq.

17. The device of claim 9 wherein the emission layer comprises 9,10-di-2-naphthaleneylanthracene or 2-(1,1-dimethylethyl)-9,10-di-2-naphthaleneylanthracene.

18. An organic light-emitting device comprising:
a) a substrate;
b) an anode and a cathode spaced from each other and disposed over the substrate;
c) an emission layer disposed between the anode and the cathode;
d) a hole-transport layer disposed between the anode and the emission layer;
e) an electron-transport layer disposed between the cathode and the emission layer;
f) the electron-transport layer comprising one or more sublayers, at least one sublayer containing a color-neutral dopant;
g) the hole-transport layer comprising one or more sublayers, at least one sublayer containing a color-neutral dopant; and
h) the color-neutral dopants including anthracene derivatives.

19. The device of claim 18 further including a hole-injection layer disposed between the anode and the hole-transport layer.

20. The device of claim 18 wherein the sublayer of the hole-transport layer closest to the anode has a thickness in the range of 2 to 200 nm and the sublayer of the hole-transport layer closest to the emission layer has a thickness in a range of 2 to 200 nm.

21. The device of claim 18 wherein each sublayer of the hole-transport layer includes a tertiary aromatic amine.

22. The device of claim 18 wherein the color-neutral dopants comprise 9,10-di-2-naphthaleneylanthracene or 2-(1,1-dimethylethyl)-9,10-di-2-naphthaleneylanthracene.

23. The device of claim 18 wherein the color-neutral dopant comprises between 0.1 and 25 percent by volume of each sublayer of the hole-transport layer in which it is present.

24. The device of claim 18 wherein the emission layer comprises Alq, Gaq, Inq, or Mgq.

25. The device of claim 18 wherein the emission layer comprises 9,10-di-2-naphthaleneylanthracene or 2-(1,1-dimethylethyl)-9,10-di-2-naphthaleneylanthracene.

26. The device of claim 18 wherein the sublayer of the electron-transport layer that is closest to the cathode does not contain the color-neutral dopant.

27. The device of claim 18 wherein the sublayer of the electron-transport layer closest to the cathode has a thickness in the range of 2 to 50 nm and the sublayer closest to the emission layer has a thickness in a range of 2 to 50 nm.

28. The device of claim 18 wherein the color-neutral dopant comprises between 0.1 and 25 percent by volume of each sublayer of the electron-transport layer in which it is present.

29. The device of claim 1 wherein the cathode is transparent.

30. The device of claim 9 wherein the cathode is transparent.

31. The device of claim 18 wherein the cathode is transparent.

* * * * *